(12) United States Patent
Recchia

(10) Patent No.: US 8,158,331 B2
(45) Date of Patent: Apr. 17, 2012

(54) METHOD OF IMPROVING PRINT PERFORMANCE IN FLEXOGRAPHIC PRINTING PLATES

(76) Inventor: David A. Recchia, Smyrna, GA (US)

( * ) Notice: Subject to any disclaimer, the term of this patent is extended or adjusted under 35 U.S.C. 154(b) by 366 days.

(21) Appl. No.: 12/571,523

(22) Filed: Oct. 1, 2009

(65) Prior Publication Data
US 2011/0081614 A1  Apr. 7, 2011

(51) Int. Cl.
*G03F 7/11* (2006.01)
*G03F 7/26* (2006.01)
*B41N 1/06* (2006.01)

(52) U.S. Cl. .................. 430/306; 430/271.1; 430/273.1; 101/453; 101/463.1

(58) Field of Classification Search .............. 430/5, 300, 430/306, 309, 944, 271.1, 273.1; 101/453, 101/463.1
See application file for complete search history.

(56) References Cited

U.S. PATENT DOCUMENTS

| | | | |
|---|---|---|---|
| 3,265,765 A | 8/1966 | Holden et al. | |
| 3,479,185 A | 11/1969 | Chambers, Jr. | |
| 3,867,153 A | 2/1975 | MacLachlan | |
| 4,254,209 A * | 3/1981 | Abe et al. | 430/272.1 |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,414,312 A | 11/1983 | Goff et al. | |
| 4,423,135 A | 12/1983 | Chen et al. | |
| 4,427,759 A | 1/1984 | Gruetzmacher et al. | |
| 4,540,649 A | 9/1985 | Sakurai | |
| 4,622,088 A | 11/1986 | Min | |
| 5,135,827 A | 8/1992 | Bohm et al. | |
| 5,223,375 A | 6/1993 | Berrier et al. | |
| 5,262,275 A | 11/1993 | Fan | |
| 5,330,882 A | 7/1994 | Kawaguchi et al. | |
| 5,506,086 A * | 4/1996 | Van Zoeren | 430/201 |
| 5,776,661 A | 7/1998 | Casaletto et al. | |
| 6,238,837 B1 | 5/2001 | Fan | |
| 6,245,487 B1 | 6/2001 | Randall | |
| 6,382,099 B1 | 5/2002 | Herrmann | |
| 6,790,598 B2 | 9/2004 | Burke et al. | |
| 7,125,650 B2 | 10/2006 | Roberts et al. | |
| 7,279,254 B2 | 10/2007 | Zwadlo | |
| 7,401,552 B2 | 7/2008 | Daems et al. | |
| 7,419,765 B2 | 9/2008 | Teltschik et al. | |
| 2003/0211423 A1 | 11/2003 | Mengel | |
| 2008/0076061 A1 | 3/2008 | Figov | |
| 2008/0076066 A1 | 3/2008 | Watanabe | |
| 2008/0305407 A1 | 12/2008 | Zwadlo et al. | |
| 2009/0186308 A1 | 7/2009 | Rudolph | |
| 2009/0191482 A1 | 7/2009 | Rudolph et al. | |
| 2009/0191483 A1 | 7/2009 | Rudolph et al. | |
| 2010/0215865 A1 | 8/2010 | Keoshkerian et al. | |

FOREIGN PATENT DOCUMENTS

| | | |
|---|---|---|
| EP | 0 456 336 A2 | 11/1991 |
| EP | 0 640 878 A1 | 3/1995 |
| GB | 1 366 769 | 9/1974 |

* cited by examiner

*Primary Examiner* — Anca Eoff
(74) *Attorney, Agent, or Firm* — Carmody & Torrance LLP

(57) ABSTRACT

A method of making a relief image printing element from a photosensitive printing blank is provided. A photosensitive printing blank with a laser ablatable layer disposed on at least one photocurable layer is ablated with a laser to create an in situ mask. The printing blank is then exposed to at least one source of actinic radiation through the in situ mask to selectively cross link and cure portions of the photocurable layer. Diffusion of air into the at least one photocurable layer is limited during the exposing step and preferably at least one of the type, power and incident angle of illumination of the at least one source of actinic radiation is altered during the exposure step. The resulting relief image comprises a plurality of dots and a dot shape of the plurality of dots is produced that is highly resistant to print fluting for printing on corrugated board.

17 Claims, 1 Drawing Sheet

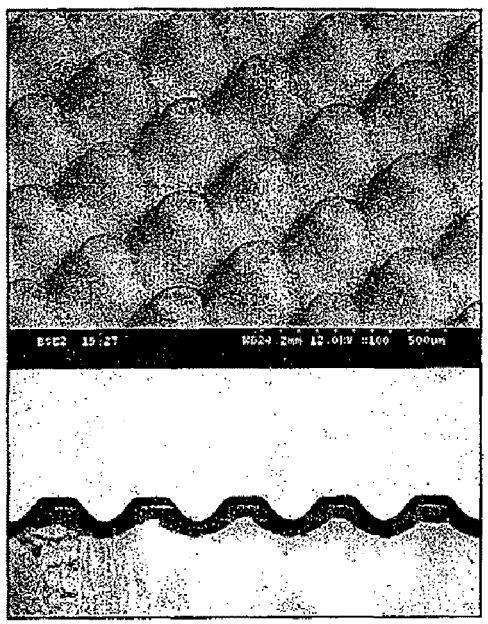
The common result
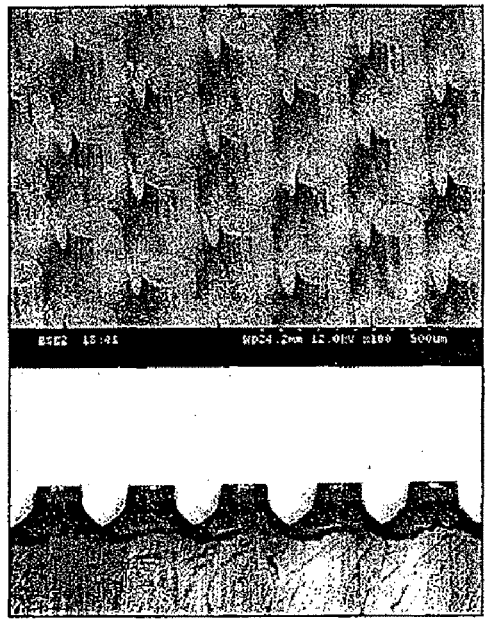
The new result

METHOD OF IMPROVING PRINT PERFORMANCE IN FLEXOGRAPHIC PRINTING PLATES

FIELD OF THE INVENTION

The present invention relates generally to a method of preparing a relief image flexographic printing element to provide an improved relief structure thereon.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

Corrugated board generally includes a corrugating medium which is typically a layer of pleated or multi-grooved paperboard, called "flute", adjacent to a flat paper or paper-like layer called a "liner." A typical corrugated board construction comprises a flute layer sandwiched between two liner layers. Other embodiments may include multiple layers of flute and/or liner. The fluted interlayer provides structural rigidity to the corrugated board. Since corrugated board is used as packaging and formed into boxes and containers, the liner layer forming an exterior surface of the corrugated board is frequently printed with identifying information for the package. The exterior liner layer often has slight indentations due to the uneven support of the underlying flute layer.

A problem that may be encountered when printing on corrugated board substrates is the occurrence of a printing effect referred to as "fluting" (and which is also known as "banding" or "striping" or "washboarding"). Fluting may occur, when printing the liner on the exterior surface of the corrugated board, after the corrugated board has been assembled. The fluting effect is visible as regions of dark printing, i.e., bands of higher density, alternating with regions of light printing, i.e., bands of lighter density that correspond to the underlying fluting structure of the corrugated board. The darker printing occurs where uppermost portions of the pleated innerlayer structure support the printing surface of the liner. The fluting effect can be apparent in areas of a printed image having tones or tint values where the inked areas represent a fraction of the total area as well as in areas of the printed image where the ink coverage is more complete. This fluting effect is typically more pronounced when printing with a flexographic printing element produced using a digital workflow process. Furthermore, increasing the printing pressure does not eliminate striping, and the increased pressure can cause damage to the corrugated board substrate. Therefore, other methods are needed to reduce striping or fluting when printing on corrugated board substrates.

A typical flexographic printing plate as delivered by its manufacturer is a multilayered article made of, in order, a backing, or support layer; one or more unexposed photocurable layers; a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. Generally the most widely used support layer is a flexible film of polyethylene teraphthalate. The support sheet can optionally comprise an adhesive layer for more secure attachment to the photocurable layer(s). Optionally, an antihalation layer may also be provided between the support layer and the one or more photocurable layers. The antihalation layer is used to minimize halation caused by the scattering of UV light within the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used.

The photocurable materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art.

The slip film is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

Photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition before image-wise exposure so that the photocurable resin composition can be more rapidly and uniformly cured.

The removal of dissolved oxygen can be accomplished, for example, by placing the photosensitive resin plate in an atmosphere of inert gas, such as carbon dioxide gas or nitrogen gas, overnight before exposure in order to displace the dissolved oxygen. A noted drawback to this method is that it is inconvenient and cumbersome and requires a large space for the apparatus.

Another approach that has been used involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. However, the pre-sensitization step can also cause shadow tones to fill in, thereby reducing the tonal range of the halftones in the image.

The bump exposure also requires specific conditions that are limited to only quench the dissolved oxygen, such as exposing time, irradiated light intensity and the like. In addition, if the photosensitive resin layer has a thickness of more than 0.1 min, the weak light of the low intensity bump exposure dose does not sufficiently reach certain portions of the photosensitive resin layer (i.e., the side of the photosensitive layer that is closest to the substrate layer and furthest from the source of actinic radiation), at which the removal of the dissolved oxygen is insufficient. In the subsequent main exposure, these portions will not cure sufficiently due to the remaining oxygen. Other efforts have involved special plate formulations alone or in combination with the bump exposure.

For example, U.S. Pat. No. 5,330,882 to Kawaguchi, the subject matter of which is herein incorporated by reference in its entirety, suggests the use of a separate dye that is added to the resin to absorb actinic radiation at wavelengths at least 100 nm removed from the wavelengths absorbed by the main photoinitiator. This allows separate optimization of the initiator amounts for the bump and main initiators. Unfortunately, these dyes are weak initiators and require protracted bump exposure times. In addition, these dyes sensitize the resin to regular room light, so inconvenient yellow safety light is required in the work environment. Lastly, the approach described by Kawaguchi employs conventional broadband-type sources of actinic radiation light for bump exposure, and thereby also tends to leave significant amounts of oxygen in the lower layers of the resin.

U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative. According to the inventors, the composition eliminates the need for pre-exposure conditioning and produces a chemically and thermally stable plate.

Other efforts have focused on adding an oxygen scavenger to the resin composition to suppress the action of the oxygen. The use of oxygen scavengers in resin systems is described, for example, in U.S. Pat. No. 3,479,185 to Chambers, Jr. and in U.S. Pat. No. 4,414,312 to Goff et al., the subject matter of each or which is herein incorporated by reference in its entirety.

However all of these methods are still deficient in producing a relief image printing element that produces a superior dot structure, especially when designed for printing corrugated board substrates.

Thus, there is a need for an improved process for preparing relief image printing elements with an improved relief structure similar to or better than the relief structure of a typical analog workflow process for printing on corrugated board substrates.

SUMMARY OF THE INVENTION

It is an object of the present invention to provide a relief image printing plate that produces a good result when printing on corrugated board substrates.

It is another object of the present invention to produce a relief image printing plate that reduces print fluting when printing on corrugated board substrates.

It is another object of the present invention to create a superior dot structure in a relief image printing element in terms of print surface, edge definition, shoulder angle, depth and dot height.

It is another object of the present invention to provide a dot shape on the printing element that is highly resistant to print fluting.

It is still another object of the present invention to control the surface roughness of the print surface of the relief image printing element.

To that end, the present invention relates generally to a method of making a relief image printing element from a photosensitive printing blank, said photosensitive printing blank comprising a laser ablatable mask layer disposed on at least one photocurable layer, the method comprising the steps of:

a) selectively laser ablating the laser ablatable mask layer to create an in situ mask and uncovering portions of the photocurable layer;

b) exposing the laser ablated printing blank to at least one source of actinic radiation through the in situ mask to selectively cross link and cure portions of the photocurable layer, wherein the diffusion of oxygen into the at least one photocurable layer is limited by deploying a diffusion barrier on top of the in-situ mask and any uncovered portions of the photocurable layer prior to step (b) wherein the diffusion barrier has an oxygen diffusion coefficient of less than $6.9 \times 10^{-9}$ m$^2$/sec, preferably less than $6.9 \times 1^{-10}$ m$^2$/sec., and most preferably less than $6.9 \times 10^{-11}$ m$^2$/sec. The diffusion bather is preferably selected from the group consisting of:
  i) laminating a barrier membrane to the in situ mask and any uncovered portions of the photocurable layer before the exposure step; and
  ii) coating the in situ mask and any uncovered portions of the photocurable layer with a layer of a liquid, preferably an oil, prior to the exposure step;
  wherein the barrier membrane and/or the layer of liquid have an oxygen diffusion coefficient of less than $6.9 \times 10^{-9}$ m$^2$/sec, preferably less than $6.9 \times 10^{-10}$ m$^2$/sec and most preferably less than $6.9 \times 10^{-11}$ m$^2$/sec.

BRIEF DESCRIPTION OF THE DRAWINGS

FIG. 1 depicts a printing element with a plurality of dots demonstrating the unique dot/shoulder structure of the invention as compared to the dots of a printing element exposed without the benefit of this invention.

DETAILED DESCRIPTION OF THE INVENTION

The inventors of the present invention have found that the shape and structure of a printing dot has a profound impact on the way it prints. Knowing this, one can manipulate the resultant shape of the printing dots by the methods as described herein. The use of these methods also acts to reduce the fluting tendency.

In order to reduce print fluting when printing on corrugated board substrates, the inventors of the present invention have found that it is necessary to (1) remove air from the exposure step; and preferably (2) alter the type, power and incident angle of illumination.

The use of these methods together yields a dot shape that is highly resistant to print fluting and shows exceptional impression latitude on press (i.e., resistance to print gain changes when more pressure is applied to the plate during printing).

The inventors herein have discovered that the most important method of beneficially changing the shape of printing dots formed on a printing element is removing or limiting diffusion of air into the photocurable layer during exposure to actinic radiation. The inventors have found that diffusion of air into the photocurable layer can be limited by:

(1) laminating a barrier membrane on top of the flexo plate to cover the in situ mask and any uncovered portions of photocurable layer. The membrane can most beneficially be applied after the laser ablation used to create the in situ mask, but before exposure to actinic radiation. The inventors of the present invention have also found that this sheet can be used to impart a defined texture to the print surface of the plate, which is an additional capability and benefit of this method.

(2) coating the in situ mask and any uncovered photopolymer layer with a liquid layer, preferably an oil;

wherein the barrier membrane and/or liquid layer have a coefficient of oxygen diffusion of less than $6.9 \times 10^{-9}$ m$^2$/sec, preferably less than $6.9 \times 10^{-10}$ m$^2$/sec and most preferably less than $6.9 \times 10^{-11}$ m$^2$/sec.

Altering the type, power and incident angle of illumination can also be useful in this regard and can be accomplished by multiple methods. For example, altering the type, power and incident angle of illumination can be accomplished by using a collimating grid above the plate during the exposure step. The use of a collimating grid for analog plates is described with respect to analog printing plates in U.S. Pat. No. 6,245,487 to Randall, the subject matter of which is herein incorporated by reference in its entirety. In the alternative, the use of a point light, or other semi-coherent light source can be used. These light sources are capable of altering the spectrum, energy concentration, and incident angle to varying degrees, depending on the light source and exposure unit design. Examples of these point light sources include Olec Corporation's OVAC exposure unit and Cortron Corporation's eXact exposure unit. Finally, a fully coherent (e.g., laser) light source can be used for exposure. Examples of the laser light sources include U.V. laser diodes used in devices such as the Luscher Xpose imager and the Heidelberg Prosetter imager. Other light sources that can alter the type, power and incident angle of illumination can also be used in the practice of the invention.

In one embodiment, the present invention relates generally to a method of making a relief image printing element from a photosensitive printing blank, said photosensitive printing blank comprising a laser ablatable mask layer disposed on at least one photocurable layer, the method comprising the steps of:

a) selectively laser ablating the laser ablatable mask layer to create an in situ mask and uncovering portions of the photocurable layer;

b) exposing the laser ablated printing blank to at least one source of actinic radiation through the in situ mask to selectively cross link and cure portions of the photocurable layer, wherein the diffusion of air into the at least one photocurable layer is limited during the exposing step by a method selected from at least one of:
  i) laminating a barrier membrane to the in situ mask and any uncovered portions of the photocurable layer before the exposure step; and
  ii) coating the in situ mask and any uncovered portions of the photocurable layer with a layer of liquid, preferably an oil, prior to the exposure step.

A wide range of materials can serve as the barrier membrane layer. Three qualities that the inventors have identified in producing effective barrier layers include optical transparency, low thickness and oxygen transport inhibition. Oxygen transport inhibition is measure in terms of a low oxygen diffusion coefficient. As noted, the oxygen diffusion coefficient of the membrane (or the liquid layer) should be less than $6.9 \times 10^{-9}$ m$^2$/sec., preferably less than $6.9 \times 10^{-10}$ m$^2$/sec. and most preferably less than $6.9 \times 10^{-11}$ m$^2$/sec.

Examples of materials which are suitable for use as the barrier membrane layer of the present invention include those materials that are conventionally used as a release layer in flexographic printing elements, such as polyamides, polyvinyl alcohol, hydroxyalkyl cellulose, copolymers of ethylene and vinyl acetate, amphoteric interpolymers, cellulose acetate butyrate, alkyl cellulose, butryal, cyclic rubbers, and combinations of one or more of the foregoing. In addition, films such as polypropylene, polyethylene, polyvinyl chloride, polyester and similar clear films can also serve well as barrier films. In one preferred embodiment, the barrier membrane layer comprises a polypropylene film or a polyethylene terephthalate film. One particularly preferred barrier membrane is a Fuji® Final Proof membrane available from Fuji Films.

The barrier membrane should be as thin as possible, consistent with the structural needs for handling of the film and the film/photopolymer plate combination. Barrier membrane thicknesses between about 1 and 100 microns are preferred, with thickness of between about 1 and about 5 microns being most preferred.

The barrier membrane needs to have a sufficient optical transparency so that the membrane will not detrimentally absorb or deflect the actinic radiation used to expose the photosensitive printing blank. As such it is preferable that the barrier membrane have an optical transparency of at least 50%, most preferably at least 75%.

The barrier membrane needs to be sufficiently impermeable to oxygen diffusion so that it can effectively limit diffusion of oxygen into the photocurable layer during exposure to actinic radiation. The inventors herein have determined that the barrier membrane materials noted above in the thicknesses noted above will substantially limit the diffusion of oxygen into the photocurable layer when used as described herein.

In addition to limiting the diffusion of oxygen into the photocurable layer, the barrier membrane can be used to impart or impress a desired texture to the printing surfaces of the printing element or to control the surface roughness of the printing surfaces of the printing element to a desired level. In one embodiment of the present invention, the barrier membrane comprises a matte finish and the texture of the matte finish may be transferred to the plate surface to provide a desired surface roughness on the surface of the printing plate. For example, in one embodiment, the matte finish provides an average surface roughness that is between about 700 and about 800 nm. In this instance the barrier membrane comprises a polypropylene film with a cured photopolymer layer thereon and the cured photopolymer layer has a defined topographic pattern defined thereon. The texture or roughness of the barrier membrane surface will be impressed into the surface of the photopolymer (photocurable) layer during the lamination step. In general, surface roughness in this regard can be measured using a Veeco Optical Profilometer, model Wyko NT 3300 (Veeco Instruments, Plainville, N.Y.).

In another embodiment of the present invention, the barrier membrane comprises a smooth nanotechnology film with a roughness of less than 100 nm. In this embodiment, the average surface roughness of the printing plate can be controlled to less than about 100 nm.

The barrier layer may be laminated to the surface of the printing plate using pressure and/or heat in a typical lamination process.

In another embodiment, the printing plate may be covered with a layer of liquid, preferably a layer of oil, prior to the exposure step, and the oil may be either clear or tinted. The liquid or oil here serves as another form of a barrier membrane. As with the solid barrier membrane, it is important that the liquid used be optically transparent to the actinic radiation used to expose the photocurable layer. The optical transparency of the liquid layer is preferably at least 50%, most preferably at least 75%. The liquid layer must also be capable of substantially inhibiting the diffusion of oxygen into the photocurable layer with an oxygen coefficient of diffusion as noted above. The liquid must also be viscous enough to remain in place during processing. The inventors herein have determined that a liquid layer from 1 μm to 100 μm in thickness comprising any of the following oils will meet the foregoing criteria: paraffinic or naphthenic hydro-carbon oils, silicone oils and vegetable based oils. The liquid should be spread upon the surface of the printing element after the in situ mask is created but before the printing blank is exposed to actinic radiation.

After the photosensitive printing blank is exposed to actinic radiation as described herein, the printing blank is developed to reveal the relief image therein. Development may be accomplished by various methods, including water development, solvent development and thermal development, by way of example and not limitation.

Finally, the relief image printing element is mounted on a printing cylinder of a printing press and printing is commenced.

What is claimed is:

1. A method of making a relief image printing element from a photosensitive printing blank, said photosensitive printing blank comprising a laser ablatable layer disposed on at least one photocurable layer, the method comprising the steps of:
   a) selectively laser ablating the laser ablatable layer to create an in situ mask and uncovering portions of the photocurable layer;
   b) exposing the laser ablated printing blank to at least one source of actinic radiation through the in situ mask to selectively cross link and cure portions of the photocurable layer,
   wherein the diffusion of air into the at least one photocurable layer is limited during the exposing step by a method selected from at least one of:
      i) laminating a barrier membrane to the in situ mask and any uncovered portions of the photocurable layer using pressure and/or heat before step (b); and
      ii) coating the in situ mask and any uncovered portions of the photocurable layer with a layer of liquid prior to step (b);
   wherein the oxygen diffusion coefficient of the barrier membrane and/or the layer of liquid is less than $6.9 \times 10^{-9}$ m$^2$/sec.

2. The method according to claim 1, wherein a barrier membrane is used and said barrier membrane comprises a material selected from the group consisting of polyamides, polyvinyl alcohol, hydroxyalkyl cellulose, copolymers of ethylene and vinyl acetate, amphoteric interpolymers, cellulose acetate butyrate, alkyl cellulose, butryal, cyclic rubbers, polypropylene, polyethylene, polyvinyl chloride, polyester and combinations of two or more of the foregoing.

3. The method according to claim 1, wherein the barrier membrane is used and the barrier membrane comprises a surface with a defined surface roughness and wherein said defined surface roughness of the surface of the barrier membrane is impressed into the photocurable layer.

4. The method according to claim 3, wherein the barrier membrane comprises a smooth surface with an average surface roughness of less than about 100 nm.

5. The method according to claim 1, wherein the in situ mask and any uncovered portions of the photocurable layer are covered with a layer of oil prior to step (b).

6. The method according to claim 1, wherein the at least one of the type, power and incident angle of illumination of the at least one source of actinic radiation is altered during the exposure step.

7. The method according to claim 2, wherein the at least one of the type, power and incident angle of illumination of the at least one source of actinic radiation is altered during the exposure step.

8. The method according to claim 2, wherein the thickness of the barrier membrane is between about 1 and about 100 micron.

9. The method according to claim 8, wherein the thickness of the barrier membrane is between about 1 and about 5 micron.

10. The method according to claim 2, wherein the barrier membrane comprises a polypropylene film.

11. The method according to claim 3, wherein the barrier membrane comprises a polyethylene terephthalate film with a cured photopolymer layer thereon.

12. The method according to claim 11, wherein the cured photopolymer layer has a defined topographic pattern defined thereon and wherein the photopolymer layer is impressed into the surface of the photocurable layer during the lamination step.

13. The method according to claim 1, further comprising the step of developing the photosensitive printing blank to reveal the relief image therein, by a method selected from the group consisting of water development, solvent development and thermal development.

14. A method according to claim 5 wherein the layer of oil is from 1 μm to 10 μm thick.

15. A method according to claim 3 wherein the barrier membrane has an optical transparency of at least 50 percent.

16. A method according to claim 14 wherein the layer of oil has an optical transparency of 50 percent.

17. A method according to any one of claims 1-5 and 6-16 wherein the oxygen diffusion coefficient is less than $6.9 \times 10^{-10}$ m$^2$/sec.

* * * * *